United States Patent [19]

Fan et al.

[11] Patent Number: 5,002,855

[45] Date of Patent: Mar. 26, 1991

[54] SOLID IMAGING METHOD USING MULTIPHASIC PHOTOHARDENABLE COMPOSITIONS

[75] Inventors: Roxy N. Fan, E. Brunswick; Abraham B. Cohen, Springfield, both of N.J.

[73] Assignee: E. I. Du Pont de Nemours and Company, Wilmington, Del.

[21] Appl. No.: 341,521

[22] Filed: Apr. 21, 1989

[51] Int. Cl.$^5$ .............................. G03C 1/492
[52] U.S. Cl. .......................... 430/270; 430/269; 430/945; 522/2; 264/22; 425/162; 425/174; 425/174.4
[58] Field of Search ............ 430/269, 270, 945; 522/2; 425/162, 174, 174.4; 264/22

[56] References Cited

U.S. PATENT DOCUMENTS

| | | | |
|---|---|---|---|
| 4,137,091 | 1/1979 | Pohl | 430/286 |
| 4,414,278 | 11/1983 | Cohen et al. | 428/402 |
| 4,575,330 | 3/1986 | Hull | 425/11 |
| 4,698,373 | 10/1987 | Tateosian et al. | 522/95 |
| 4,721,735 | 1/1988 | Bennett et al. | 522/71 |
| 4,726,877 | 2/1988 | Fryd et al. | 156/630 |
| 4,752,498 | 6/1988 | Fudim | 427/54.1 |

FOREIGN PATENT DOCUMENTS

250121 6/1987 European Pat. Off.

Primary Examiner—Jack P. Brammer

[57] ABSTRACT

An integral three-dimensional object is formed from a photohardenable liquid composition containing radiation deflecting matter.

13 Claims, 5 Drawing Sheets

SOLID IMAGING METHOD USING MULTIPHASIC PHOTOHARDENABLE COMPOSITIONS

FIELD OF THE INVENTION

This invention relates to production of three-dimensional objects by photohardening, and more particularly to a method utilizing photohardenable materials characterized by self limiting the depth of photohardening during irradiation.

BACKGROUND OF THE INVENTION

Many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

These approaches relate to the formation of solid sectors of three-dimensional objects in steps by sequential irradiation of areas or volumes sought to be solidified. Various masking techniques are described as well as the use of direct laser writing, i.e., exposing a photohardenable polymer with a laser beam according to a desired pattern and building a three-dimensional model layer by layer.

However, all these approaches fail to identify practical ways of utilizing the advantages of vector scanning combined with means to maintain constant exposure and attain substantially constant final thickness of all hardened portions on each layer throughout the body of the rigid three-dimensional object. Furthermore, they fail to recognize very important interrelations within specific ranges of operation, which govern the process and the apparatus parameters in order to render them practical and useful. Such ranges are those of constant exposure levels dependent on the photohardening response of the material, those of minimum distance traveled by the beam at maximum acceleration dependent on the resolution and depth of photohardening, as well as those of maximum beam intensity depend on the photospeed of the photohardenable composition.

The Scitex patent, for example, suggests the use of photomasks or raster scanning for achieving uniform exposure, but does not suggest a solution for keeping the exposure constant in the case of vector scanning. The use of photomasks renders such techniques excessively time consuming and expensive. Raster scanning is also undesirable compared to vector scanning for a number of reasons, including:

- necessity to scan the whole field even if the object to be produced is only a very small part of the total volume,
- considerably increased amount of data to be stored in most cases,
- overall more difficult manipulation of the stored data, and
- the necessity to convert CAD-based vector data to raster data.

On the other hand, in the case of vector scanning only the areas corresponding to the shape of the rigid object have to be scanned, the amount of data to be stored is smaller the data can be manipulated more easily, and "more than 90% of the CAD based machines generate and utilize vector data" (Lasers & Optronics, January 1989, Vol. 8, No. 1, pg. 56). The main reason why laser vector scanning has not been utilized extensively so far is the fact that, despite its advantages, it introduces problems related to the inertia of the optical members, such as mirrors, of the available deflection systems for the currently most convenient actinic radiation sources, such as lasers. Since these systems are electromechanical in nature, there is a finite acceleration involved in reaching any beam velocity. This unavoidable non-uniformity in velocity results in unacceptable thickness variations. Especially in the case of portions of layers having no immediate previous levels of exposure at the high intensity it becomes necessary to use high beam velocities, and therefore, longer acceleration times, which in turn result in thickness non-uniformity. The use of low intensity lasers does not provide a good solution since it makes production of a solid object excessively time consuming. In addition, the usefulness of vector scanning is further minimized unless at least the aforementioned depth and exposure level relationships are observed as evidenced under the Detailed Description of this invention.

No special attention has been paid so far to the composition itself by related art in the field of solid imaging, except in very general terms.

Thus, the compositions usually employed, present a number of different problems, a major one of which is excessive photohardening depthwise usually accompanied by inadequate photohardening widthwise. This problem becomes especially severe in cantilevered or other areas of the rigid object, which areas are not immediately over a substrate.

Therefore, it is an object of this invention to resolve the problem cited above by incorporating radiation deflecting matter in the photohardenable composition in order to limit the depth of photohardening with simultaneous increase of the width of photohardening, so that the resolution is better balanced in all directions.

European Patent Application 250,121 (Scitex Corp., Ltd.) discloses a three-dimensional modelling apparatus using a solidifiable liquid which includes radiation transparent particles in order to reduce shrinkage.

SUMMARY OF THE INVENTION

The instant invention is directed to methods for direct production of three-dimensional photohardened solid objects, layer by layer using actinic radiation, preferably in a beam form such as provided by lasers for direct writing, by utilizing photohardenable compositions, which contain radiation deflection matter in order to limit the depth of photohardening with simultaneous increase of the width of photohardening, so that the resolution is better balanced in all directions. The integrity of the integral three-dimensional objects or parts thus formed is also highly improved.

This invention may be summarized as follows:

A method for accurately fabricating an integral three-dimensional object from successive layers of a photohardenable liquid composition comprising the steps of:

(a) forming a layer of a photohardenable liquid;
(b) photohardening at least a portion of the layer of photohardenable liquid by exposure to actinic radiation;
(c) introducing a new layer of photohardenable liquid onto the layer previously exposed to actinic radiation;

(d) photohardening at least a portion of the new liquid layer by exposure to actinic radiation, with the requirement that the photohardenable composition comprises an ethylenically unsaturated monomer, a photoinitiator, and radiation deflecting matter, the deflecting matter having a first index of refraction, and the rest of the composition having a second index of refraction, the absolute value of the difference between the first index of refraction and the second index of refraction being different than zero.

BRIEF DESCRIPTION OF THE DRAWING

The reader's understanding of practical implementation of preferred embodiments of the invention will be enhanced by reference to the following detailed description taken in conjunction with perusal of the drawing FIGURE, wherein.

DETAILED DESCRIPTION OF THE INVENTION

The instant invention is directed to methods for direct production of three-dimensional photohardened solid objects, layer by layer using actinic radiation, preferably in a beam form such as provided by lasers for direct writing, by using photohardenable compositions comprising an ethylenically unsaturated monomer, a photoinitiator, and radiation deflecting matter, the deflecting matter having a first index of refraction, and the rest of the composition having a second index of refraction, the absolute value of the difference between the first index of refraction and the second index of refraction being different than zero.

As aforementioned, many systems for production of three-dimensional modeling by photohardening have been proposed. European Patent Application No. 250,121 filed by Scitex Corp. Ltd. on June 6, 1987, provides a good summary of documents pertinent to this art area, including various approaches attributed to Hull, Kodama, and Herbert. Additional background is described in U.S. Pat. No. 4,752,498 issued to Fudim on June 21, 1988.

Figure 1:
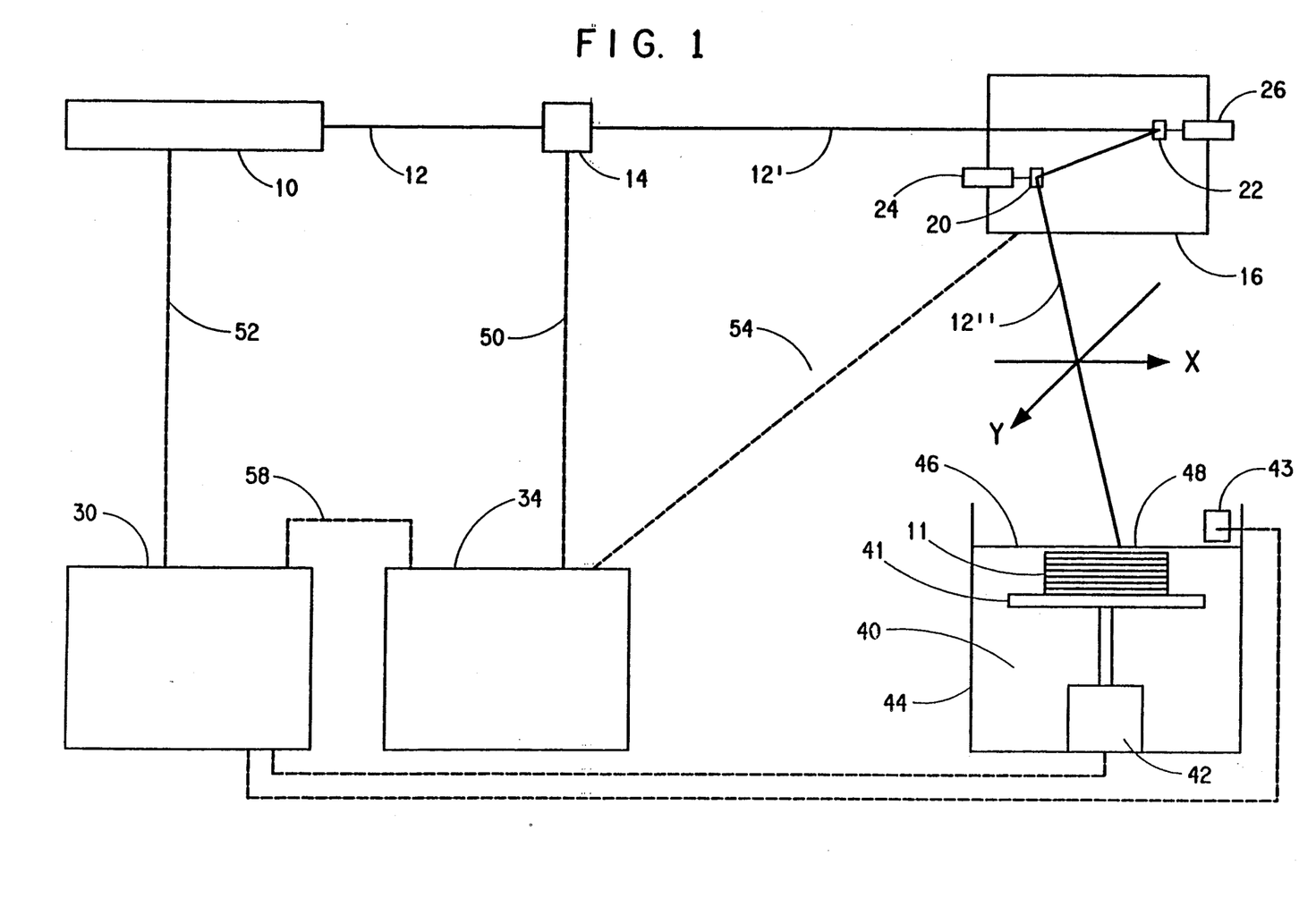
FIG. 1 is a block diagram of an apparatus used to perform the preferred embodiment of the process of the instant invention.

In a preferred embodiment, an apparatus for practicing the present invention is depicted in FIG. 1, in the form of a block diagram. The apparatus and its operation are described below.

Actinic radiation means 10 shown in FIG. 1, which is preferably a high power laser, is used to provide an actinic radiation beam 12 having a certain intensity. The radiation beam 12 is passed through a modulator 14, where its intensity may be modulated. The modulated beam 12' is passed in turn through deflection means 16 such as a vector scanner in the form of a two-mirror 20 and 22 assembly, each mirror separately driven by a different motor 24 and 26 respectively. By causing mirror 20 driven by motor 24 to turn, the beam is deflected in an X direction, while by causing mirror 22 to turn, the beam is deflected in a Y direction, X direction being perpendicular to the Y direction. The actinic radiation beam 12" is thus controllably deflected towards preselected portions of the photohardenable composition which is contained in vessel 44 and presents a surface 46. It photohardens a thin layer 48 closest to the surface 46 of a photohardenable composition 40, to a depth of photohardening which equals the maximum thickness of the layer 48. The composite movement of the beam is preferably a vector type movement, and the beam is said to move or be scanned in a vector mode. Due to the inertia of the electromechanical deflection means 16, the velocity of the beam 12" on the thin layer 48 is also limited by the inertia and the electromechanical nature of the deflection means 16.

The deflection of the two mirrors 20 and 22 through motors 24 and 26 respectively is controlled by the second computer control means 34, while the graphic data corresponding to the shape of the solid object under production are stored in the first computer control means 30.

The second computer control means 34 is coupled with the modulation means 14, the deflection means 16, and the first computer control means 30, through control/feedback lines 50, 54, and 58, respectively. The data stored in computer control means 30 are fed to computer control means 34, and after being processed cause motors 24 and 26 to turn and move mirrors 20 and 22 accordingly in order to deflect the beam towards predetermined positions on the thin layer 48. Electrical feedback regarding the relative movements of the mirrors 20 and 22 is provided by the deflection means to the second computer control means 34 through line 54.

The manner of introducing successive layers of photohardenable liquid and exposing to actinic radiation such as a laser will generally be by two methods. In a first method a pool of liquid is present in a vessel and it is not necessary to introduce additional photohardenable liquid. In such case a movable table or floor supports the liquid. Initially the table or floor is elevated with a portion of the photohardenable liquid present above the table or floor and a portion of the liquid present in the vessel around the edge of the table or floor and/or underneath it. (Illustratively a table is present which allows liquid to flow underneath the table as it is used.) After exposure and photohardening of a portion of the liquid layer above the table, the table is lowered to allow another layer of photohardenable liquid to flow on top of the previous layer followed by exposure of predetermined area on the newly applied liquid layer. If necessary due to the shape of the final three-dimensional article the thickness of more than one liquid layer can be photohardened. This procedure of table or floor lowering and exposure continues until formation of the desired three-dimensional article occurs.

In a second method a movable table or floor need not be employed but rather a new quantity of photohardenable liquid is introduced into a vessel after an exposure step in formation of a new liquid layer on a previously exposed layer containing both photohardened liquid photohardenable material. Criticality is not present in the manner of liquid introduction but rather in an ability to photoharden successive liquid layers.

In FIG. 1, a movable table 41 is initially positioned within the photohardenable composition 40, a short predetermined distance from the surface 46, providing a thin layer 48 between the surface 46 and the table 41. The positioning of the table is provided by the placement means 42, which in turn is controlled by the first computer control means 30 according to the data stored therein. The graphic data corresponding to the first layer of the shape of the rigid object are fed from computer control means 30 to computer control means 34, where they are processed along with feedback data obtained from deflecting means 16, and are fed to modulator 14 for controlling the same, so that when the beam travels in a vector mode on predetermined portions of the thin layer 48, the exposure remains constant.

When the first layer of the rigid object is complete, the movable table 41 is lowered by a small predetermined distance by the placement means 42 through a command from first computer control means 30. Following a similar command from computer means 30, layer forming means, such as doctor knife 43 sweeps the surface 46 for leveling purposes. The same procedure is then followed for producing the second, third, and the following layers until the rigid object is completed.

In the discussions above and below, the actinic radiation, preferably in the form of a beam, and more preferably in the form of a laser beam, is many times referred to as light, or it is given other connotations. This is done to make the discussion clearer in view of the particular example being described. Thus, it should not be taken as restricting the scope and limits of this invention. Nevertheless, the preferred actinic radiation is light, including ultraviolet (UV), visible, and infrared (IR) light. From these three wavelength regions of light, ultraviolet is even more preferred.

The formulation of the photohardenable compositions for solid imaging purposes is very important in order to receive the desirable effects and characteristics, regardless of whether the scanning is of the vector type, raster type, or any other type, and the discussion hereinafter is referred to in any type of scanning, unless otherwise stated. However, from the different types of scanning, the vector type is the preferred type of scanning.

A photohardenable composition for solid imaging should contain at least one photohardenable monomer or oligomer and at least one photoinitiator. For the purposes of this invention, the words monomer and oligomer have substantially the same meaning and they may be used interchangeably.

Examples of suitable monomers which can be used alone or in combination with other monomers include tbutyl acrylate and methacrylate, 1,5-pentanediol diacrylate and dimethacrylate, N,N-diethylaminoethyl acrylate and methacrylate, ethylene glycol diacrylate and dimethacrylate, 1,4-butanediol diacrylate and dimethacrylate, diethylene glycol diacrylate and dimethacrylate, hexamethylene glycol diacrylate and dimethacrylate, 1,3-propanediol diacrylate and dimethacrylate, decamethylene glycol diacrylate and dimethacrylate, 1,4-cyclohexanediol diacrylate and dimethacrylate, 2,2-dimethylolpropane diacrylate and dimethacrylate, glycerol diacrylate and dimethacrylate, tripropylene glycol diacrylate and dimethacrylate, glycerol triacrylate and trimethacrylate, trimethylolpropane triacrylate and trimethacrylate, pentaerythritol triacrylate and trimethacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate and tetramethacrylate, 2,2-di-(p-hydroxyphenyl)-propane dimethacrylate, triethylene glycol diacrylate, polyoxyethyl-2,2-di(p-hydroxyphenyl)propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of 1,4-butanediol, triethylene glycol dimethacrylate, polyoxypropyltrimethylol propane triacrylate, butylene glycol diacrylate and dimethacrylate, 1,2,4-butanetriol triacrylate and trimethacrylate, 2,2,4-trimethyl-1,3-pentanediol diacrylate and dimethacrylate, 1-phenyl ethylene-1,2-dimethacrylate, diallyl fumarate, styrene, 1,4-benzenediol dimethacrylate, 1,4-diisopropenyl benzene, and 1,3,5-triisopropenyl benzene. Also useful are ethylenically unsaturated compounds having a molecular weight of at least 300, e.g., alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Particularly preferred monomers are ethoxylated trimethylolpropane triacrylate, ethylated pentaerythritol triacrylate, dipentaerythritol monohydroxypentaacrylate, 1,10-decanediol dimethylacrylate, di-(3-acryloxy-2-hydroxylpropyl)ether of bisphenol A oligomers, di-(3-methacryloxy-2-hydroxyl alkyl)ether of bisphenol A oligomers, urethane diacrylates and methacrylates and oligomers thereof, coprolactone acrylates and methacrylates, propoxylated neopentyl glycol diacrylate and methacrylate, and mixtures thereof.

Examples of photoinitiators which are useful in the present invention alone or in combination are described in U.S. Pat. No. 2,760,863 and include vicinal ketaldonyl alcohols such as benzoin, pivaloin, acyloin ethers, e.g., benzoin methyl and ethyl ethers, benzil dimethyl ketal; α-hydrocarbon-substituted aromatic acyloins, including α-methylbenzoin α-allylbenzoin, α-phenylbenzoin, 1-hydroxylcyclohexyl phenol ketone, diethoxyphenol acetophenone, 2-methyl-1-[4-(methylthio)-phenyl]-2-morpholino-propanone-1. Photoreducible dyes and reducing agents disclosed in U.S. Pat. Nos. 2,850,445, 2,875,047, 3,097,096, 3,074,974, 3,097,097 and 3,145,104, as well as dyes of the phenazine, oxazine, and quinone classes, Michler's ketone, benzophenone, acryloxy benzophenone, 2,4,5-triphenylimidazolyl dimers with hydrogen donors including leuco dyes and mixtures thereof as described in U.S. Pat. Nos. 3,427,161, 3,479,185 and 3,549,367 can be used as initiators. Also useful with photoinitiators are sensitizers disclosed in U.S. Pat No. 4,162,162. The photoinitiator or photoinitiator system is present in 0.05 to 10% by weight based on the total weight of the photohardenable composition. Other suitable photoinitiation systems which are thermally inactive but which generate free radicals upon exposure to actinic light at or below 185° C. include the substituted or unsubstituted polynuclear quinones which are compounds having two intracyclic carbon atoms in a conjugated carbocyclic ring system, e.g., 9,10-anthraquinone, 2-methylanthraquinone, 2- ethylanthraquinone, 2-tert-butylanthraquinone, octamethylanthraquinone, 1,4-naphthoquinone, 9,10-phenanthraquinone, benz(a)anthracene-7,12-dione, 2,3-naphthacene-5,12-dione, 2-methyl-1,4-naphthoquinone, 1,4-dimethyl-anthraquinone, 2,3-dimethylanthraquinone, 2-phenylanthraquinone, 2,3-diphenylanthraquinone, retenequinone, 7,8,9,10-tetrahydronaphthacene-5,12-dione, and 1,2,3,4-tetrahydrobenz(a)anthracene-7,12-dione; also, alpha amino aromatic ketones, halogenated compounds like Trichloromethyl substituted cyclohexadienones and triazines or chlorinated acetophenone derivatives, thioxanthones in presence of tertiary amines, and titanocenes.

Although the preferred mechanism of photohardening is free radical polymerization, other mechanisms of photohardening apply also within the realm of this invention. Such other mechanisms include but are not limited to cationic polymerization, anionic polymerization, condensation polymerization, addition polymerization, and the like.

Other components may also be present in the photohardenable compositions, e.g., pigments, dyes, extenders, thermal inhibitors, interlayer and generally interfacial adhesion promoters, such as organosilane coupling agents, dispersants, surfactants, plasticizers, coating aids such as polyethylene oxides, etc. so long as the photohardenable compositions retain their essential properties. The plasticizers can be liquid or solid as well as polymeric in nature. Examples of plasticizers are diethyl phthalate, dibutyl phthalate, butyl benzyl phthalate, dibenzyl phthalate, alkyl phosphates, polyalkylene glycols, glycerol, poly(ethylene oxides), hydroxy ethylated alkyl phenol, tricresyl phosphate, triethyleneglycol diacetate, triethylene glycol caprate - caprylate, dioctyl phthalate and polyester plasticizers.

In this discussion a clear distinction should be made between a photohardenable and a photohardened composition. The former refers to one which has not yet been subjected to irradiation, while the latter refers to one which has been photohardened by irradiation.

The instant invention is intended for solid imaging techniques which use photohardenable compositions comprising an ethylenically unsaturated monomer, a photoinitiator, and radiation deflecting matter, the deflecting matter having a first index of refraction, and the rest of the composition having a second index of refraction, the absolute value of the difference between the first index of refraction and the second index of refraction being different than zero.

When the composition is clear to the radiation beam, the depth of photohardening is considerably larger than the width of photohardening, mainly because the beams utilized, such as laser beams, and the like, are well collimated and focused. Addition of inert particulate matter, which is transparent to the radiation in the environment of the composition, has certain well recognized advantages, such as reduction of shrinkage upon polymerization or photohardening in general, and often increase in photospeed due to the reduction of the amount of active composition, which is subject to shrinkage, per unit of volume.

The large depth of photohardening is not a very big problem in areas supported by a substrate, since the depth is determined primarily by the thickness of the liquid layer on top of the substrate. However, in cantilevered unsupported areas, where the thickness of the liquid is very large, it becomes a serious disadvantage, as the depth of photohardening is not controlled or limited any more by the substrate. This is actually the area where the differences between conventional two dimensional imaging and solid or three-dimensional imaging manifest themselves as being most profound. This is particularly important when there are uncontrollable exposure variations, which may result in thickness variations, and poor resolution. Thus a way to control the thickness is needed.

In addition to the lack of control of the depth of photohardening, there is one more problem having to do with resolution considerations. Except in very limited occasions, it is highly desirable for the resolution or tolerances of a part to be comparable in all dimensions. It does not make much sense to have high resolution in one dimension and very poor resolution in another dimension since the final resolution is going to be necessarily considered as poor, except in rare occasions as mentioned above. In clear compositions, the depth to width ratio is high, and thus the resolution widthwise is accordingly higher than the resolution depthwise. As a matter of fact, the resolution is inversely proportional to the dimensional units, and therefore, if the depth to width ratio is for example 5, the width resolution will be five times better than the depth resolution, when other factors do not play an active role. Thus, high transparency of the composition becomes in general undesirable. Preferable regions of depth to width ratios are 7:1 to 1:1, and more preferable 3:1 to 1:1.

The task of reducing the transparency or in other words increasing the optical density, also referred to as opacity, of the photohardenable composition sounds as a rather straightforward one, and it is, if photospeed and other important parameters are not taken into account. For example, addition of a radiation absorbent in the composition will decrease the depth of photohardening without affecting considerably the width. Typical absorbents are dyes. The monomers or oligomers of the composition may also act as absorbants to different degrees. However, if a dye, or other absorbent is used, the part of the radiation which is absorbed by it will not be available to directly promote photohardening.

Considering now the photoinitiator as means of absorption to reduce the depth of photohardening, it should be realized that in order for this to happen a certain high content in photoinitiator has to be exceeded. As the content in photoinitiator in the composition increases from zero incrementally, the photospeed increases but at the same time the depth also increases since low starving areas at the bottom of the depth of photohardening form now more polymer due to the increase in number of free radicals. Only when the radiation starts being intercepted to a considerable degree by an excessive amount of photoinitiator, will the depth of photohardening start decreasing. However, the properties of the photohardened object will start deteriorating. This is because as the concentration of free radicals being formed increases the molecular weight decreases, and therefore the structural properties deteriorate. At the same time, in the plethora of free radicals, the free radicals may start combining with each other and just absorb energy without fulfilling their role of photoinitiation. Thus, although the amount of photoinitiator can in a limited way serve as means for controlling the depth of photohardening, other undesirable phenomena occurring simultaneously, decrease considerably its usefulness when employed only by itself for this purpose.

According to this invention, a separate phase of dispersed particulate solid matter and emulsified liquid matter may be utilized to control the depth/width relation, under certain conditions, which involve refraction or reflection or scattering of light or any combination thereof, labelled as radiation deflection for the purposes of this discussion. If everything else is kept constant, as the content in separate phase of radiation deflecting matter is increased, so does the width in expense of the depth. Since the radiation is not absorbed but just deflected, no considerable loss of radiation occurs, and therefore, there is no substantial loss of photospeed. Thus, the radiation deflective matter which may be utilized in the preferred embodiments of this invention is substantially non-transparent in the environment of the photohardenable composition, since it gives opacity to the same.

It is essential to note that the phenomena of transparency, and non-transparency (translucence, opacity, absorbance) are only important when examined in the environment and conditions within the limits of which they occur. A powder for example dispersed in a medium, is transparent to radiation if not only it does not absorb inherently the radiation, but also if it has substantially the same index of refraction as the medium so that no light deflection takes place at or around the interface of each particle of the powder and the medium. The same powder, when dispersed in a liquid of substantially different refraction index, it will appear as translucent or opaque (hindering at least part of the light to travel directly through the medium containing the powder); in other words it will appear as non-transparent. Thus, translucence and opacity may have similar end results as absorbance regarding amount of light passing through.

The amount of light-deflecting matter to give optimum properties to the photohardenable composition is a function of a number of factors, as shown below, as well as of the balance of gains and compromises that constitute what is considered to be "optimum" at the time, depending on the particular circumstances. Thus, it would not be appropriate to attempt to give absolute numbers in order to show how one can achieve optimum properties. It would rather be much more accurate to show the interrelationships governing these factors, in order to allow a person skilled in the art to practice this invention and select a set of properties that he or she would consider optimum for the desired result. It is preferable that there is an adequate amount of radiation deflecting matter in the composition to reduce the depth of photohardening by at least 10%, more preferably at least by 20%, and even more preferably at least by 40%. It is also preferable that the depth to width ratio does not increase by such addition. In any case, the amount of light deflecting matter may be from 5% to 70% by weight, depending on the degree of deflection that it may provide. In less extreme cases with regard to both particle size and refraction index, it would be preferable for the amount of the deflecting matter in the composition to range within 10% and 60%, and most preferable within 20% and 50% by weight. As mentioned before, matter such as radiation deflecting matter is desirable also for reducing shrinkage and increasing photospeed.

Initially, if we call "particle" each individual unit of the separate phase of the dispersed or emulsified matter in the photohardenable composition as aforementioned, the maximum particle size, measured as the average particle diameter, should be smaller than the depth of photohardening, but not width necessarily. It is preferred that not only substantially all particles are smaller than the depth of photohardening, but also that at least 90% of the particles are smaller than half the depth of photohardening, and even more preferred that at least 90% of the particles are smaller than one tenth the depth of photohardening.

In order to be effective for their purpose, the majority of particles should also be preferably larger than approximately half the wavelength of the beam's radiation. At approximately half the wavelength, the scattering yield of the particles attains a maximum value, while it decreases rapidly as the size of the particles goes down. On the other hand, as the particle size increases over about half the wavelength of the radiation, the scattering yield also starts dropping, but at a lower pace. As the particle size increases even more, the phenomena of refraction and reflection start prevailing. In practice there are only limited situations where all particles have substantially the same size, in which case they are called monodisperse. Generally, there is a distribution of particle sizes providing a combination of all types of actinic-radiation deflection. Taking into account also that the higher the refractive index of the particle the higher the scattering, one can practically achieve any desired opacity, by lowering or raising the content in deflecting matter, which in turn will control the depth of photohardening.

The separate phase of the deflection matter should have a different refraction index than that of the rest of the photohardenable composition. The two refraction indices should preferably be differing by at least 0.01, more preferably by at least 0.02, and even more preferably by at least 0.04.

It is also preferable that the refraction index of the phase of the deflection matter is higher than that of the photohardenable composition, and the mixture gives even higher refraction index differences upon exposure, as long as it falls within the above limitations. Higher photospeed is obtained.

There are instances where the initially opaque composition may become less opaque or even substantially transparent after exposure. This condition is less desirable, and in order to be operable in terms of this invention, it will require considerably larger amounts of radiation deflecting matter.

Reduction of the depth of photohardening to a desired level takes place with:
  increased difference between the refractive index of the composition containing no radiation deflecting matter and the deflecting matter itself;
  increased content in radiation deflecting matter; decrease particle size;
  increased difference in refractive index due to the result of actinic radiation.

Solid deflecting materials that may be employed in the photohardenable composition are powders falling within the ranges of particle size and requirements needed for the refraction indices mentioned above. They include particulate organic polymeric compounds which are substantially insoluble in the photohardenable composition, and particulate inorganic compounds which are also substantially insoluble in the photohardenable composition. Oxygen bearing inorganic compounds such as relatively non-reactive oxides and hydroxides are preferable. Carbides and nitrides may also be used, as well as fluorides such as calcium fluoride.

Examples of preferred organic polymeric compounds are crosslinked mono- or multifunctional monomers, such as the ones given above in the list of exemplary monomers usable within the scope of this invention, polyamides, polyimides, fluoropolymers, and mixtures thereof. Of particular preference are crosslinked polyacrylates, polymethacrylates, as in U.S. Pat. No. 4,414,278, polytetrafluoroethylene, polyfluoroethylene-propylene, copolymers of perfluoroalkoxy fluoroethylene and tetrafluoroethylene, polyethylene, polypropylene, and mixtures thereof, as well as powdered engineering plastics.

Examples of preferred inorganic compounds are as aforementioned, not too reactive oxides and hydroxides, such as the oxides and hydroxides of aluminum, silicon, magnesium, zinc, zirconium, and chemical or physical mixtures thereof. A chemical mixture is a distinct and different compound, such as aluminum silicate in the case of aluminum oxide and silicon oxide, while a physical mixture of these two oxides is the unreacted combination of silicon oxide with aluminum oxide. Other more reactive oxides and hydroxides, such as those of the alkalis and the alkaline earths may be used in chemical mixtures of oxides and hydroxides, as long as the chemical mixture becomes reasonably non-reactive. Calcium aluminosilicate for example is a chemical mixture of calcium oxide, silicon oxide and aluminum oxide, which is not reactive, but contains reactive calcium oxide in a chemical mixture Conventional glasses are also good examples of inert chemical mixtures, which nevertheless contain both reactive and relatively non-reactive oxides. Carbonates, and especially those of the alkaline earths are also useful for the practice of the instant invention Dispersants used to disperse solid deflecting matter and emulsifiers to emulsify liquid deflecting matter in the photohardenable composition also play an important role regarding uniformity, stability, and the like. They may also influence the particle or micelle size and therefore the behavior of the composition towards its radiation deflection properties.

Figure 2:
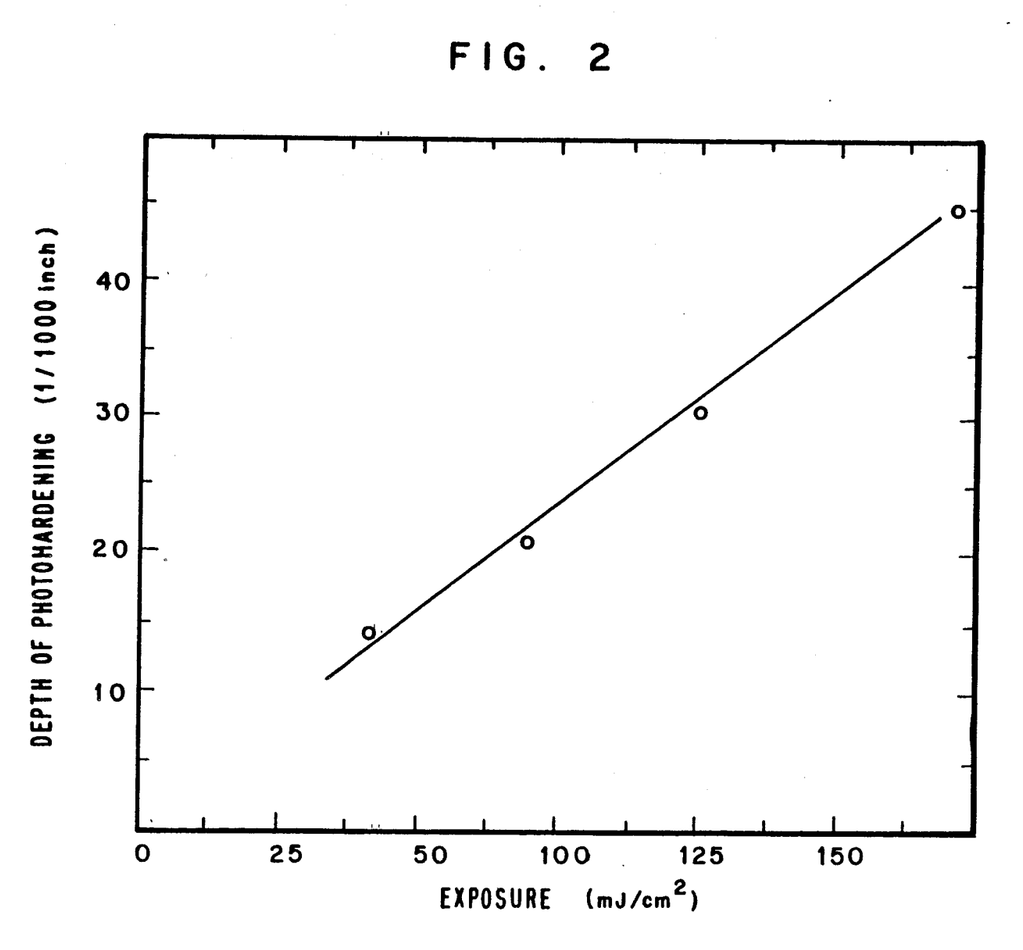
FIG. 2 shows a typical relationship between depth of photohardening and exposure in the case of a clear photohardenable composition.
Figure 3:
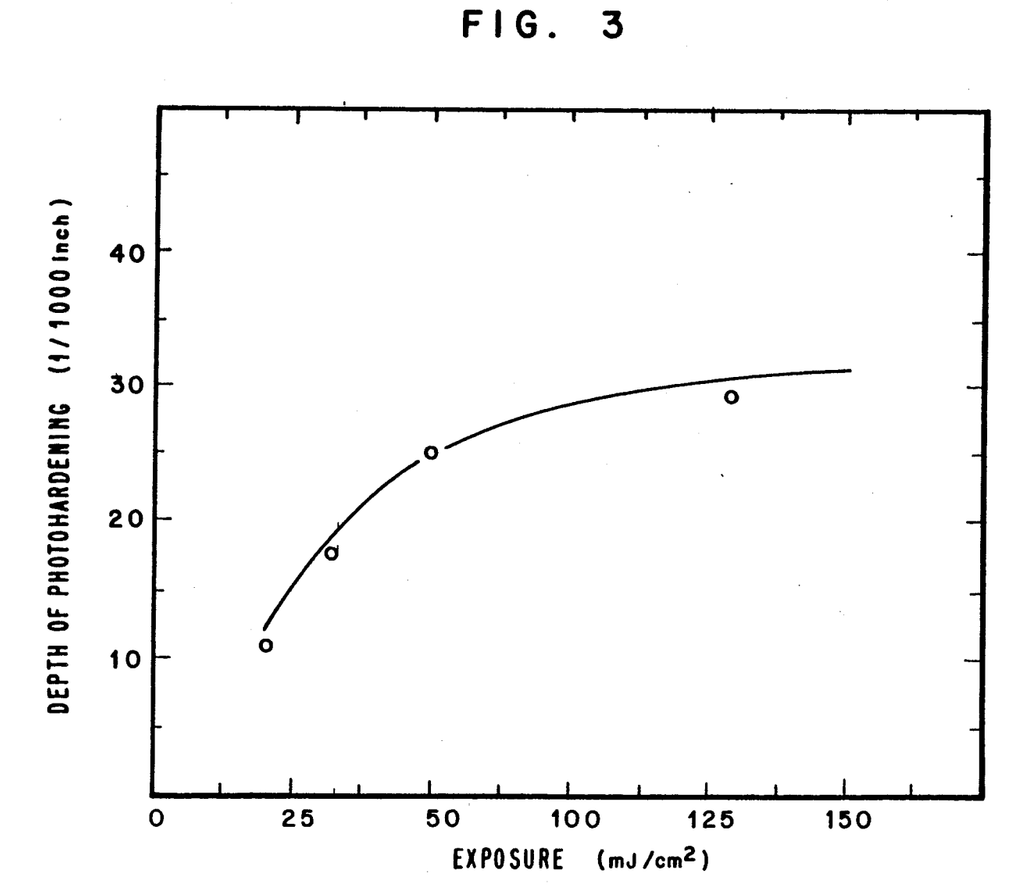
FIG. 3 shows a typical relationship between depth of photohardening and exposure in the case of a photohardenable composition containing radiation deflecting matter.
Figure 5:
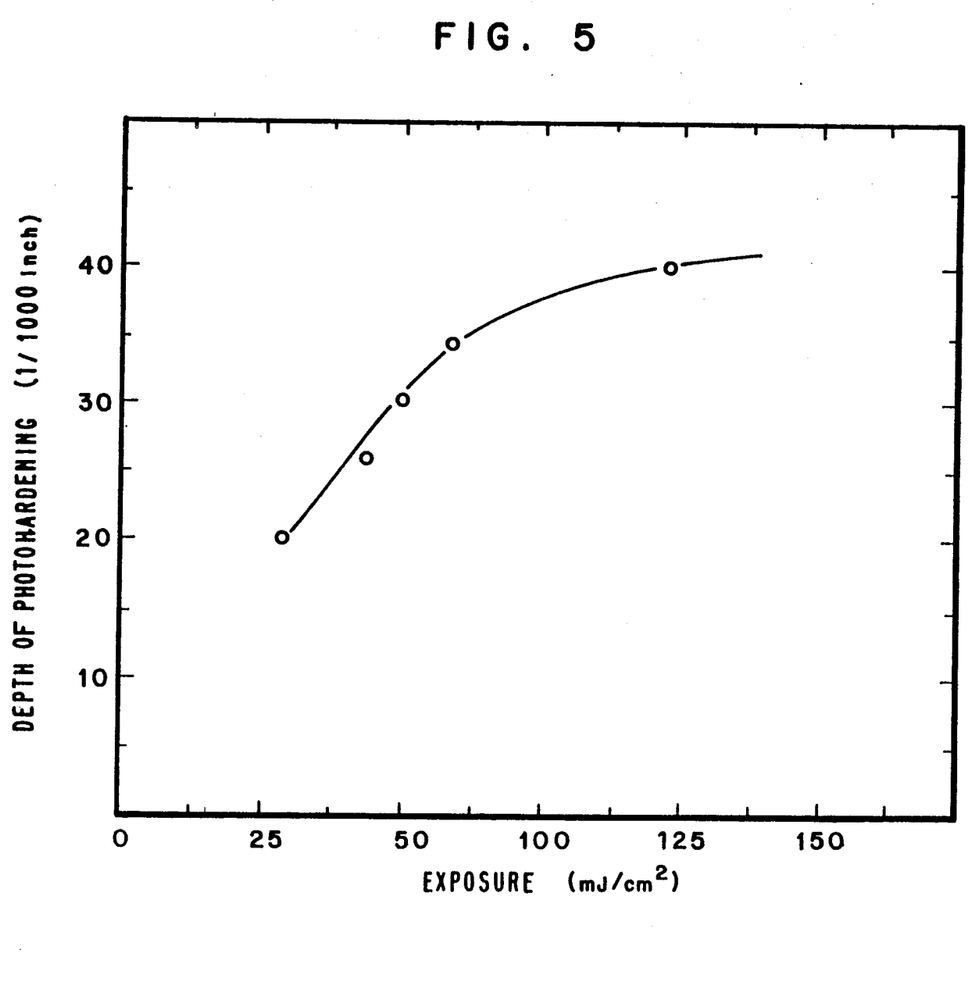
FIG. 5 shows a typical relationship between depth of photohardening and exposure in the case of a photohardenable composition containing radiation deflection matter.

FIGS. 3 and 5 show the effect of radiation deflecting matter on the depth of photohardening. As the exposure increases, the depth is approaching a plateau. In the case of clear compositions, as shown in FIG. 2, corresponding to the sample of Example 2, there is no such plateau within the examined regions of exposure. Due to refraction index considerations, as discussed earlier, the content in radiation deflecting matter has to be increased in the case of crosslinked Trimethylol propane triacrylate (TMPTA) in monomeric TMPTA in order to give appreciable self limiting characteristics to the depth of photohardening (Example 5).

Examples of photohardenable compositions are given below for illustration purposes only, and should not be construed as restricting the scope or limits of this invention. Quantities are given by weight in grams.

EXAMPLE 1

(Sample preparation)

The samples described in the Examples cited below, were prepared as follows:

The photohardenable composition was poured into a stainless steel square cavity (1 ¾"×1 ¾"×110 mils thick). The excess liquid was removed by a doctor knife blade. The liquid was exposed with a rectangular pattern (1 9/16"×1 ¼") using an argon ion laser beam at 350–360 nm wavelengths as described above.

After exposure, the solidified pattern was removed from the cavity with a pair of tweezers, and then blotted dry. The thickness of the pattern was measured and plotted against different exposure levels.

Other pertinent observations were also made.

EXAMPLE 2

The following ingredients were mixed with a mechanical mixer until a homogeneous mixture was received:

| | |
|---|---|
| Novacure 3704 (monomer) (Bisphenol A bis(2-hydroxypropyl) diacrylate) | 50 |
| TMPTA (Monomer) (Trimethylol propane triacrylate) | 50 |
| Irgacure 651 by Ciba Geigy (initiator) (2,2-dimethoxy 2-phenylacetophenone) | 1.6 |

A sample was made as described in Example 1. The relation of depth of photohardening versus exposure is shown in FIG. 2. The exposed sample remained clear.

EXAMPLE 3

The following ingredients were mixed with a mechanical mixer until a homogeneous mixture was received:

| | |
|---|---|
| Novacure 3704 (Bisphenol A bis(2-hydroxypropyl) diacrylate | 40 |
| TMPTA (Trimethylol Propane Triacrylate) | 40 |
| Plasthall 4141 (CP Hall Company) (Triethylene glycol caprate - caprylate) | 20 |
| Irgacure 651 (2,2-dimethoxy-2 phenylacetophenone) | 1.6 |

Figure 4:
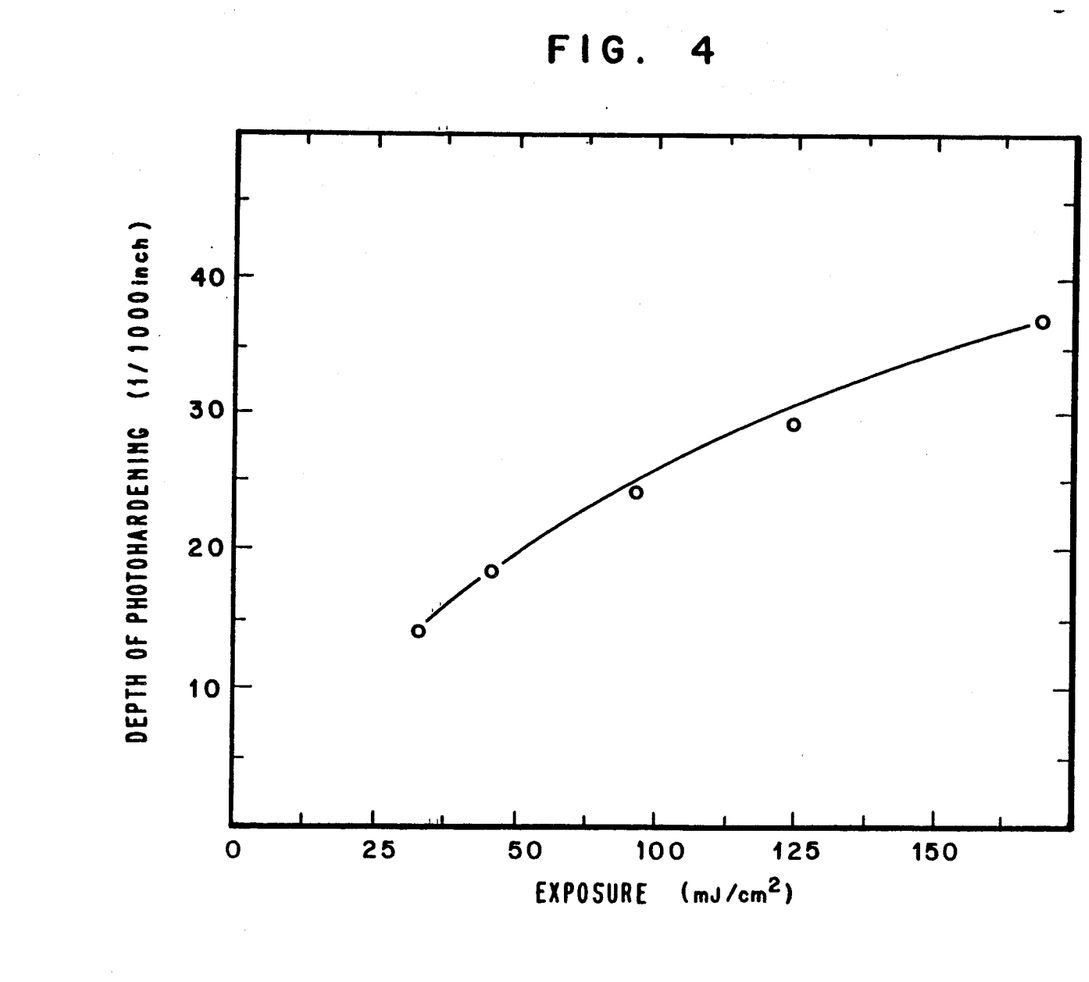
FIG. 4 shows the relationship between depth of photohardening and exposure in the case of the same photohardenable composition shown in FIG. 3 with no radiation deflecting matter contained therein.

A sample was made as described in Example 1. The relationship between Depth of photohardening and exposure is shown in FIG. 4.

EXAMPLE 4

The following ingredients were mixed in a Waring Blender at high speed for 2 minutes, and the mixture was allowed to degas:

| | |
|---|---|
| Novacure 3704 (Bisphenol A bis(2-hydroxypropyl) diacrylate) | 24.0 |
| TMPTA (Trimethylol Propane Triacrylate) | 24.0 |
| Plasthall 4141 (Triethylene glycol caprate - caprylate) | 12.0 |
| Triton X-100 (Octyl phenol poly ether alcohol) | 0.8 |
| Crosslinked TMPTA beads (Prepared as described in Example 2 of U.S. Pat. No. 4,414,278) | 40.0 |
| Irgacure 651 (2,2-dimethoxy-2 phenylacetophenone) | 1.6 |

A sample was made as described in Example 1. The relationship between Depth of photohardening and exposure is shown in FIG. 3. The sample was opaque before and after photohardening.

EXAMPLE 5

The following ingredients were mixed with a mechanical mixer until a homogeneous mixture was received:

| | |
|---|---|
| TMPTA (Trimethylol Propane Triacrylate) | 60.0 |
| Crosslinked TMPTA beads (Prepared as described in Example 2 of U.S. Pat. No. 4,414,278) | 40.0 |
| Irgacure 651 (2,2-dimethoxy-2-phenylacetophenone) | 0.4 |

A sample was made as described in Example 1. The relationship between Depth of photohardening and exposure is shown in FIG. 5. The sample was opaque before and after photohardening.

EXAMPLES 6A TO 6C

| | 6A | 6B | 6C |
|---|---|---|---|
| Novacure 3704 [Bisphenol A bis(2-hydroxypropyl) diacrylate] | 50.0 | 50.0 | 50.0 |
| TMPTA (Trimethylol Propane Triacrylate) | 50.0 | 50.0 | 50.0 |
| Triton X-100 (Octyl Phenol polyether alcohol) | 1.0 | 1.0 | 1.0 |
| Irgacure 651 (2,2-dimethoxy-2-phenylacetophenone | 0.93 | 0.6 | 0.54 |
| alpha-Alumina (average particle size 2.4 micrometers by ALCOA | 132.0 | — | — |
| Polytetrafluoroethylene powder (average particle size 3.0 micrometers by MicroPowders, Inc. | — | 50.0 | — |
| Polyethylene powder (average particle size 2 micrometers, by Dura Commodities Corporation) | — | — | 33.0 |

The above ingredients were mixed with a Waring blender at maximum speed for 2 minutes.

The samples prepared above were subjected to the conditions of Example 1. The minimum exposure required to give an integral film was 8.6 mJ/cm$^2$ in the case of 6A, 17.4 mJ/cm$^2$ in case 6B, and 32.5 mJ/cm$^2$ in the case of 6C.

All samples gave self-limiting characteristics regarding depth of photohardening. They were opaque before and after exposure. Sample 6A gave excellent photospeed as shown above.

EXAMPLE 7

A three-dimensional object was made for 50 successive layers of the composition described in Example 4, by using the method of this invention. An argon ion laser at 350–360 nm wavelength was utilized as the radiation source. The diameter of the laser beam was 5 thousands of one inch. Each layer had a thickness of 10 thousandths of one inch.

What is claimed is:

1. A method for accurately fabricating an integral three-dimensional object from successive layers of a photohardenable liquid composition comprising the steps of:
   (a) forming a layer of a photohardenable liquid;
   (b) photohardening at least a portion of the layer of photohardenable liquid by exposure to actinic radiation;
   (c) introducing a new layer of photohardenable liquid onto the layer previously exposed to actinic radiation; and
   (d) photohardening at least a portion of the new liquid layer by exposure to actinic radiation, with the requirement that the photohardenable composition comprises an ethylenically unsaturated monomer, photoinitiator, and radiation deflecting matter selected from the group consisting of an emulsified liquid, a solid which is substantially insoluble in the photohardenable composition and combination thereof, the deflecting matter deflecting the actinic radiation and having a first index of refraction, the remainder of the composition except for the deflecting matter having a second index of refraction, the absolute value of the difference between the first index of refraction and the second index of refraction being greater than 0.01.

2. The method of claim 1 wherein steps (c) and (d) are successively repeated.

3. The method of claim 2, wherein the actinic radiation is in the form of a beam.

4. The method of claim 3, wherein the beam is a laser beam.

5. The method of claim 2, wherein the deflecting matter is an emulsified liquid.

6. The method of claim 2, wherein the deflecting matter is a dispersed solid.

7. The method of claim 2, wherein the dispersed solid comprises a particulate organic polymeric compound.

8. The method of claim 2, wherein the dispersed solid comprises a particulate inorganic compound.

9. The method of claim 2, wherein the inorganic compound contains chemically bound oxygen.

10. The method of claim 9, wherein the inorganic compound is selected from the group consisting of oxides and hydroxides of aluminum, silicon, magnesium, zinc, zirconium, and mixtures thereof.

11. The method of claim 2 wherein the deflection matter comprises a combination of emulsified liquid and dispersed solid.

12. The method of claim 2 wherein the deflection matter has higher refractive index than the rest of the composition.

13. A three-dimensional solid part obtained by the method of claim 2.

* * * * *